United States Patent
Devam et al.

(10) Patent No.: US 11,683,018 B2
(45) Date of Patent: Jun. 20, 2023

(54) CLASS A AMPLIFIER WITH PUSH-PULL CHARACTERISTIC

(71) Applicant: Analog Devices International Unlimited Company, Limerick (IE)

(72) Inventors: Mayank Devam, Bengaluru (IN); Venkata Aruna Srikanth Nittala, Bengaluru (IN); Abhishek Bandyopadhyay, Winchester, MA (US)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 17/478,032

(22) Filed: Sep. 17, 2021

(65) Prior Publication Data

US 2023/0091543 A1   Mar. 23, 2023

(51) Int. Cl.
   *H03F 3/45*   (2006.01)
   *H03F 3/26*   (2006.01)

(52) U.S. Cl.
   CPC .................................. *H03F 3/4521* (2013.01)

(58) Field of Classification Search
   CPC ............ H03F 3/45659; H03F 3/45192; H03F 2203/45406; H03F 2203/45664; H03F 3/4521
   USPC ................................................ 330/252–261
   See application file for complete search history.

(56) References Cited

U.S. PATENT DOCUMENTS

| | | | |
|---|---|---|---|
| 3,184,687 A | 5/1965 | Wilkins | |
| 3,320,543 A | 5/1967 | Abram et al. | |
| 3,495,181 A | 2/1970 | Reiffin | |
| 4,638,260 A | 1/1987 | Hamley | |
| 5,015,966 A | 5/1991 | Mcintyre | |
| 5,175,533 A | 12/1992 | Krenik | |
| 5,416,442 A | 5/1995 | Hobrecht | |
| 5,939,944 A | 8/1999 | Gibson | |
| 7,005,921 B2* | 2/2006 | McCalmont | ........ H03F 3/45659 330/257 |
| 7,564,308 B1* | 7/2009 | Vats | .................... H03F 3/45121 330/290 |
| 8,026,765 B2 | 9/2011 | Giovannotto | |
| 10,038,404 B1 | 7/2018 | Sarais et al. | |
| 10,361,672 B2 | 7/2019 | Randall | |
| 10,432,153 B2 | 10/2019 | Wang | |
| 10,594,263 B2 | 3/2020 | Amorosa et al. | |
| 10,848,109 B2 | 11/2020 | Day | |
| 2020/0395908 A1 | 12/2020 | Schindler et al. | |

FOREIGN PATENT DOCUMENTS

FR   3084223   1/2020

* cited by examiner

*Primary Examiner* — Hieu P Nguyen
(74) *Attorney, Agent, or Firm* — Schwegman Lundberg & Woessner, P.A.

(57) ABSTRACT

An amplifier circuit comprises a first amplifier circuit stage including input devices connected to inputs of the amplifier circuit, a second amplifier circuit stage coupled to the first amplifier stage, a common mode extraction circuit configured to extract a DC common mode voltage of the first amplifier stage, and a bias circuit configured to bias one or more output devices of the second amplifier circuit stage using the DC common mode voltage.

17 Claims, 8 Drawing Sheets

CLASS A AMPLIFIER WITH PUSH-PULL CHARACTERISTIC

FIELD OF THE DISCLOSURE

This document relates to integrated circuits and in particular to integrated amplifier circuits.

BACKGROUND

Amplifier circuits can be used to increase the voltage, current or power of an electrical signal. Different power amplifier types are designated using different amplifier classes, such as class A, class B, class AB, etc. Selecting an amplifier of a specific class when designing an electronic circuit or system usually involves a tradeoff among different performance parameters, e.g., power used by the amplifier, signal noise introduced by the amplifier, area or size of the amplifier, etc. Sometimes conventional amplifier classes do not have parameters appropriate for a particular circuit or system implementation.

SUMMARY OF THE DISCLOSURE

This document relates generally to amplifier circuits and more specifically to circuit topologies that provide small area amplifier circuits with push-pull capability. In some aspects, an amplifier circuit includes a first amplifier circuit stage including input devices connected to inputs of the amplifier circuit, a second amplifier circuit stage coupled to the first amplifier stage, a common mode circuit configured to extract a direct current (DC) common mode voltage of the first amplifier stage, and a bias circuit configured to bias one or more output devices of the second amplifier circuit stage using the DC common mode voltage.

In some aspects, a method of operating an amplifier circuit includes receiving an input signal using a differential input circuit stage of the amplifier circuit, extracting a DC common mode voltage of the differential input circuit stage, generating a gate bias voltage using the extracted DC common mode voltage, biasing multiple output devices of a differential output stage of the amplifier circuit using the gate bias voltage, and driving the differential output stage of the amplifier circuit using push-pull capability of the biased multiple output devices.

In some aspects, an electronic circuit includes an input circuit stage including a differential input amplifier circuit, a common mode circuit configured to extract a direct current (DC) common mode voltage of the differential input amplifier circuit, an output circuit stage coupled to the input circuit stage and including a differential common source amplifier circuit, and a biasing circuit configured to bias gate regions of multiple output devices of the output circuit stage using the DC common mode voltage. The gate-biased output devices have push-pull capability.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Amplifier circuits can be used to increase the voltage, current or power of an electrical signal. An amplifier circuit that belongs to a conventional amplifier class may not be able to provide the operating parameters needed.

Figure 1:
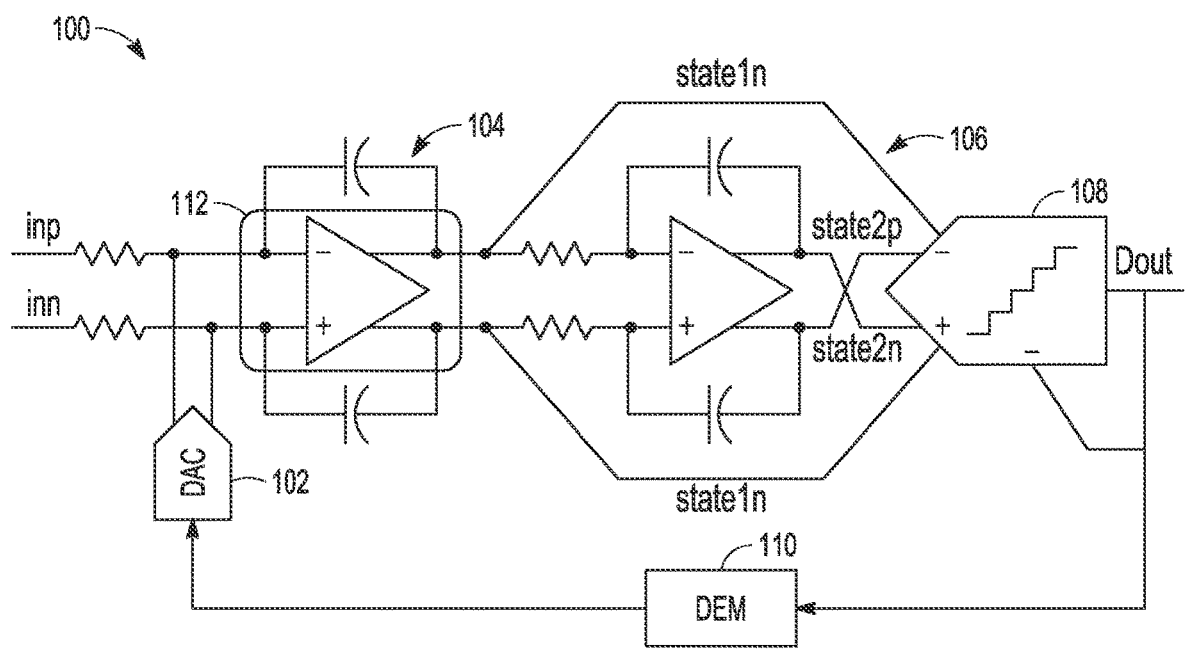
FIG. 1 is a circuit diagram of an example of a continuous time delta sigma modulator circuit.

FIG. 1 is a circuit diagram of an example of a continuous time delta sigma modulator (CTDSM) circuit that uses a cascaded integrated feedforward (CIFF) architecture. The CTDSM 100 provides analog-to-digital (A/D) conversion of an analog input signal. The CTDSM 100 includes a digital-to-analog converter (DAC) circuit, a loop filter that includes a first integrator stage 104, a second integrator stage 106, an analog-to-digital converter (ADC) circuit 108, and a decimator (DEM) circuit 110. The CTDSM with the CIFF architecture provides low distortion from noise and is useful for low power applications.

The first integrator stage 104 has a low output swing. Due to the low output swing, using a class A type amplifier for the amplifier circuit 112 in the first integrator stage 104 is a suitable choice. The output stage of a class A amplifier is always on during the full cycle of an alternating current (AC) analog input signal. A class A amplifier provides high signal gain, low noise distortion and takes up a relatively small amount of area. However, using a class A amplifier has disadvantages that may make it undesirable for use in the CTDSM 100. For instance, a class A amplifier usually consumes more power than would be desirable in the CTDSM. Also, a class A amplifier has limited push-pull capability. Push-pull refers to a capability of the output an amplifier. A push-pull amplifier output may have a complementary pair of transistors (e.g., on n-type metal oxide semiconductor (NMOS) transistor and one p-type metal oxide semiconductor (PMOS) transistor). One device (e.g., the NMOS device) sinks current from the load to ground and the other device (e.g., the PMOS device) sources current to the load from the high circuit supply.

A class AB amplifier provides push-pull capability. In a class AB amplifier, for small input signals, both output transistors are active, and the class AB amplifier acts like a class A amplifier. For large input signals, only one transistor is active for each half of the waveform, and a class AB amplifier acts like a class B amplifier. But using a class AB amplifier in the CTDSM 100 also has disadvantages. The class AB amplifier typically uses a biasing circuit for class AB operation that would increase the power consumption of the first integrator stage 104. Also, the biasing circuit for class AB operation adds additional noise to the circuit.

Figure 2:
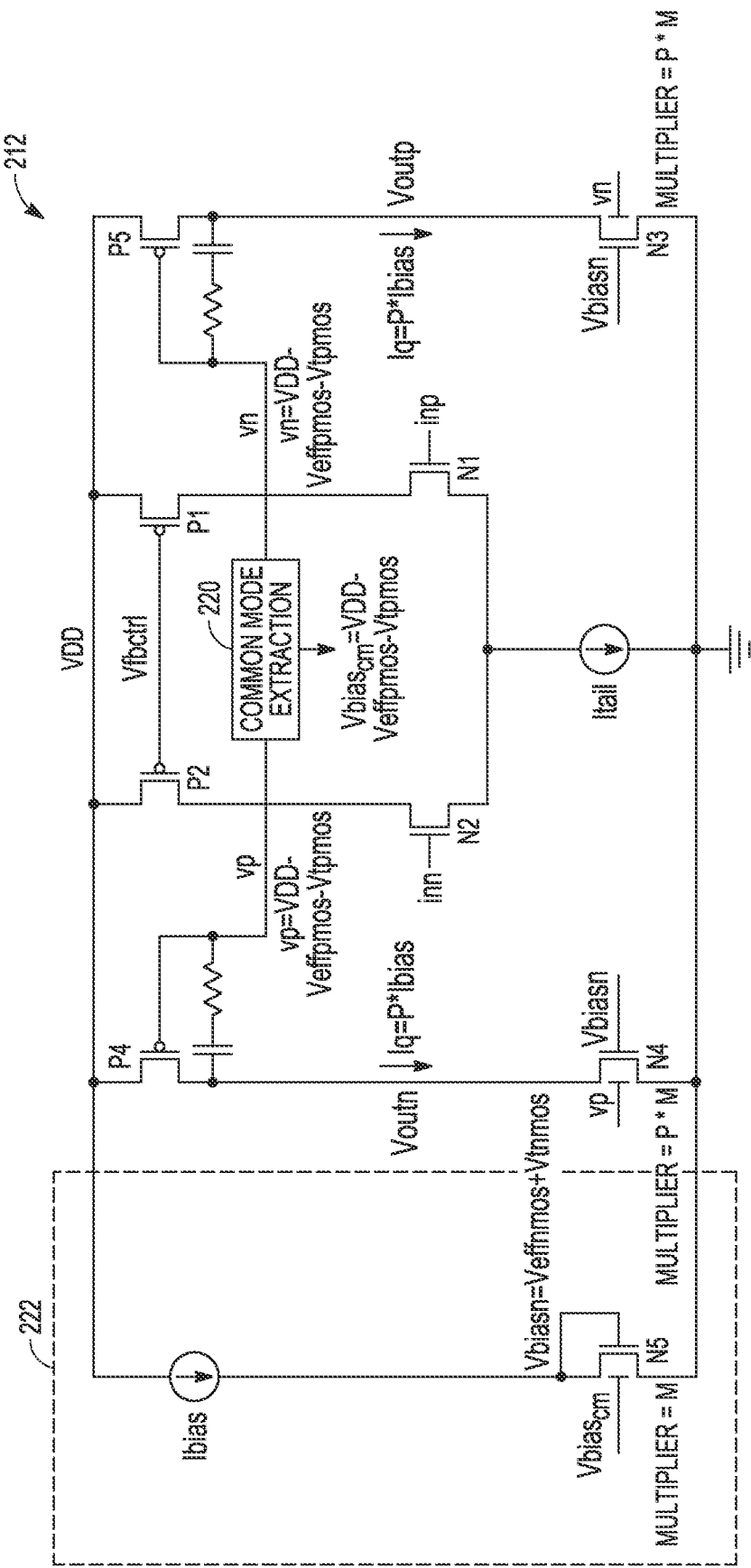
FIG. 2 is a circuit diagram of an example of an amplifier circuit optimal for use in the circuit example of FIG. 1.

FIG. 2 is a circuit diagram of an example of an amplifier circuit 212 that is more optimal for use in the CTDSM 100 of FIG. 1 than a conventional class A or class AB amplifier.

The amplifier circuit 212 operates similar to a conventional class A amplifier but provides improved push-pull capability without the disadvantages of a conventional class AB amplifier.

The amplifier circuit 212 includes an input circuit stage and an output circuit stage. The amplifier input circuit stage is a differential input amplifier and includes n-type field effect transistors (NFETs) N1 and N2 and p-type field effect transistors (PFETs) P1 and P2. Transistors N1 and N2 are input devices connected to inputs inp and inm of the amplifier circuit 212. The output circuit stage is coupled to the input circuit stage and includes PFETs P4 and P5 and NFETs N3 and N4. The amplifier output circuit stage is a differential common source amplifier circuit that has a differential output, and the output devices N3, N4, P4, and P5 are connected to outputs voutp and voutm of the amplifier circuit 212. In variations, the input circuit stage and the output circuit stage are implemented using bipolar junction transistors (BJTs).

The amplifier circuit 212 also includes a common mode circuit 220 and a bias circuit 222. The common mode circuit 220 extracts a direct current (DC) common mode voltage of the input stage and provides this voltage as a DC common mode bias ($Vbias_{CM}$) to the bias circuit 222. The DC common mode bias is set according to voltages at circuit nodes vp and vn. In the example of FIG. 2, the DC common mode bias is equal to $$Vbias_{CM} = VDD - Veff pmos - Vtpmos,$$

where VDD is the circuit supply voltage, Veffpmos is the gate-to-source voltage of PFET P4 or P5, and Vtpmos is the threshold voltage of PFET P4 or P5. The bias circuit 222 biases one or more devices of the output circuit stage using the DC common mode bias.

The bias circuit 222 includes current source Ibias and a diode connected transistor (NFET N5). The DC common mode bias is connected to the bulk of the diode connected transistor N5 to generate a gate bias voltage (Vbiasn). In the example of FIG. 2, bias circuit 222 biases output devices N4 and N3. For output device N4, the gate region is biased using Vbiasn and the bulk of N4 is connected to the gate region of output device P4, which does not have gate-biasing. For output device N3, the gate region is biased using Vbiasn and the bulk of N3 is connected to the gate region of output device P5, which does not have gate biasing. The bulk of NFET devices N3, N4, and N5 can be isolated P-well. The P-well acts like a second gate terminal (i.e., a back gate terminal) and provides extra transconductance (gm) to drive the output circuit stage of the amplifier 212.

The quiescent current (Iq) in the output stage is fixed to $$Iq = P * Ibias,$$

where P is the multiplier ratio of device N5 to N4 and N3. Circuit nodes vp and vn are used to drive the bulks (or back gates) of output devices N3 and N4. This provides a feed-forward gain from the input circuit stage to the output circuit stage through the PFET path (P4, P5) of the amplifier circuit 212. The back gate configuration of the output devices N3, N4 provides some push-pull capability to the devices and the amplifier circuit 212 has class AB amplifier capability. Because the back gate P-well voltage of devices N3, N4, and N5 never exceeds VDD, the configuration of the amplifier circuit 212 ensures no forward biasing of PN junctions of the devices.

Figure 3:
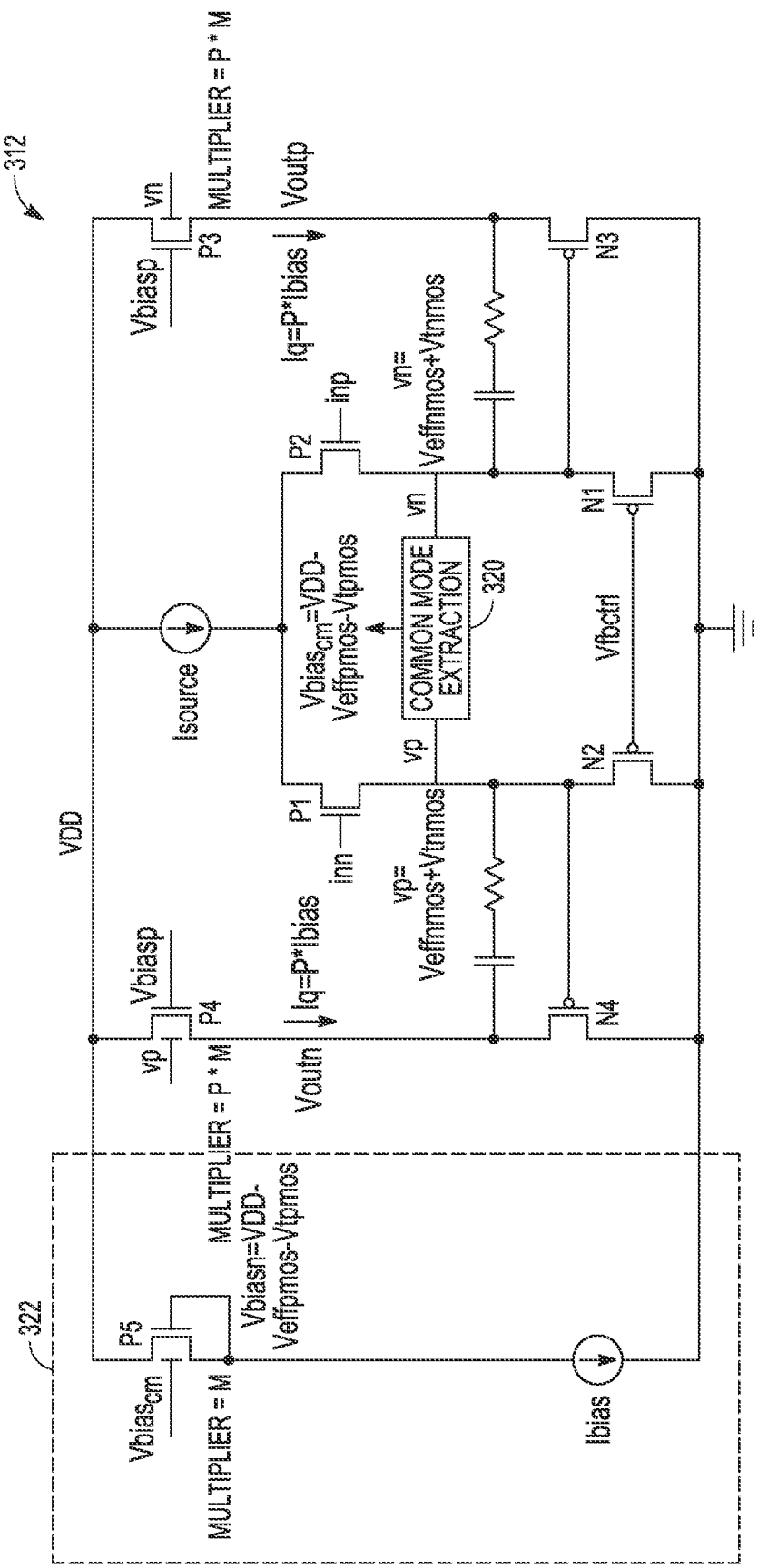
FIG. 3 is a circuit diagram of another example of an amplifier circuit.

FIG. 3 is a circuit diagram of another example of an amplifier circuit 312. In this example, the input differential pair are PFET devices P1 and P2. Bias circuit 322 includes current source Ibias and diode connected PFET P5. The DC common mode bias voltage ($Vbias_{CM}$) is extracted using common mode extraction circuit 320. In the example of FIG. 3, the DC common mode bias is equal to $$Vbias_{CM} = Veff nmos + Vtnmos.$$

The DC common mode bias is used to generate the gate bias voltage (Vbiasp). The bulk of device P5 is connected to the DC common mode voltage. The gate regions of output devices P3 and P4 are connected to gate bias voltage and the bulk of devices P3 and P4 are connected to circuit nodes vp and vn, respectively.

The circuit nodes vp and vn drive the bulk of devices P3 and P4 and this arrangement provides a feed-forward gain from the input circuit stage to the output circuit stage. The bulk of devices P3, P4, and P5 can be N-well. The N-well acts like a second gate terminal (i.e., a back gate terminal as in the example of FIG. 2) and provides extra gm to drive the output stage of the amplifier. Thus, the amplifier circuit 312 also provides push-pull capability in the output stage. The bulk N-well voltage of devices P3, P4, and P5 never goes below circuit ground, and like the example of FIG. 2, the configuration of the amplifier circuit 312 ensures no forward biasing of PN junctions of the devices.

Figure 4:
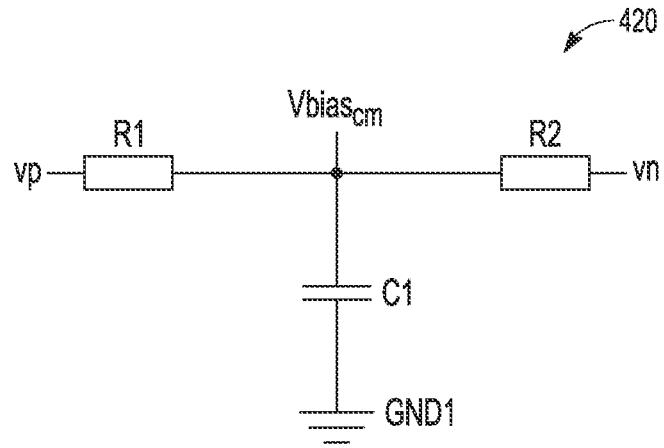
FIG. 4 is a circuit diagram of an example of a common mode extraction circuit.

FIG. 4 is a circuit diagram of an example of a common mode extraction circuit 420 useable for common extraction circuit 220 in FIG. 2 or common mode extraction circuit 320 in FIG. 3. In the example amplifier circuits of FIGS. 2 and 3, there is a positive common mode feedback loop due to the bias network used to bias the output devices. The capacitor C1 in the common mode circuit suppresses the effect of the common mode feedback loop for high frequencies.

Figure 5:
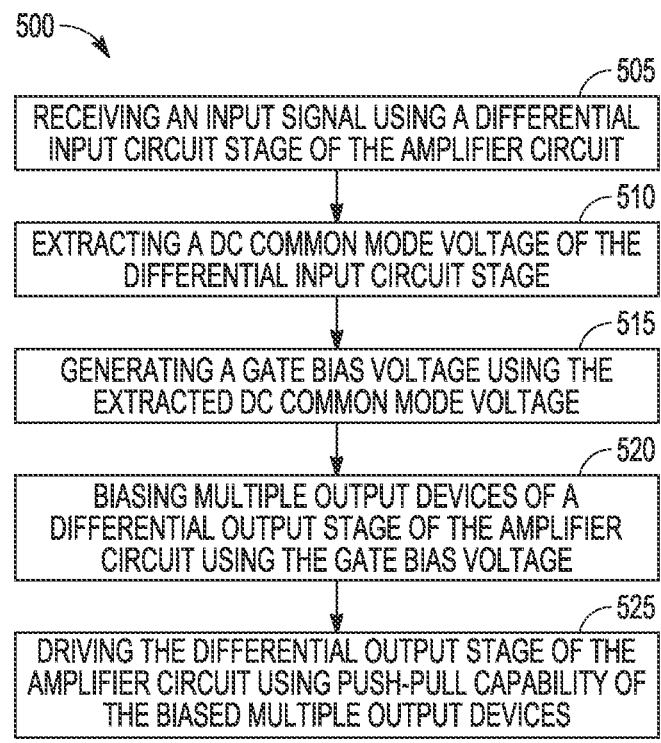
FIG. 5 is a flow diagram of an example of operating an amplifier circuit.

FIG. 5 is a flow diagram of a method 500 of operating an amplifier that outlines the approaches described above. At block 505, an input signal is received using a differential input circuit stage of the amplifier circuit. Common mode information of the input stage is extracted and used to bias devices of the output circuit stage. At block 510, the common mode voltage of the differential input stage is extracted (e.g., by using a common mode circuit), and at block 515 a gate bias voltage is generated using the extracted DC common mode voltage. At block 520, this gate bias voltage is used to bias output devices of the differential output circuit stage of the amplifiers. The bulk (or back gates) of the biased output devices can be driven using the gate voltages of complimentary output devices. This arrangement provides push-pull capability for the output devices and at block 525 allows the output devices to drive the output circuit stage using push-pull.

The differential input circuit stage can be, among other things, a differential amplifier circuit as in the examples of FIGS. 2 and 3, a differential telescopic amplifier circuit, a folded cascode differential input circuit, or a differential amplifier circuit having complementary type input device pairs.

Figure 6:
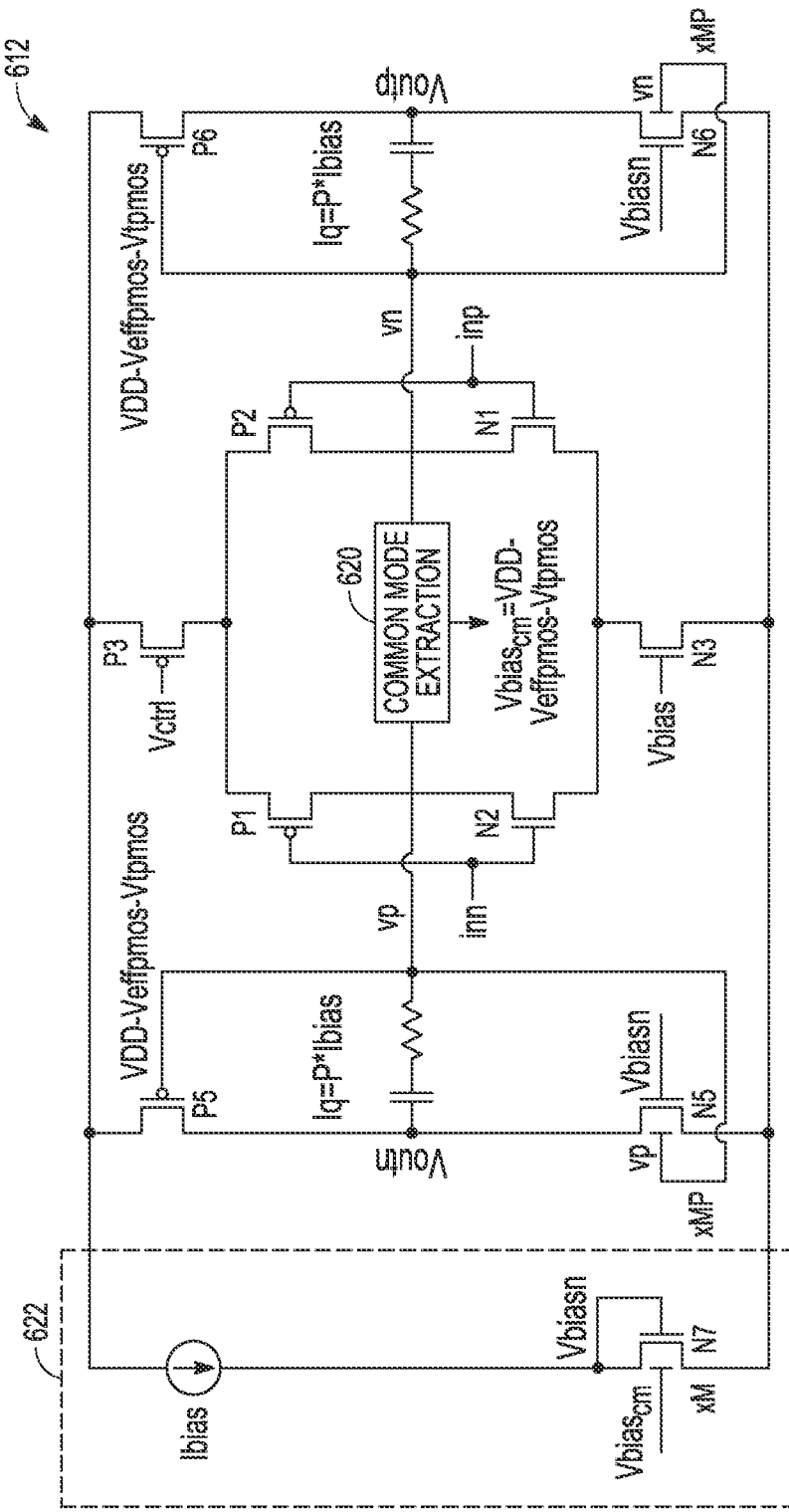
FIGS. 6-9 are circuit diagrams of further examples of amplifier circuits.

FIG. 6 is a circuit diagram of another example of an amplifier circuit 612. The amplifier input circuit stage is a differential amplifier circuit having complementary NFET and PFET input device pairs N1, P1 and N2, P2. The amplifier output circuit stage includes output devices N5, P5, N6, and P6. The biasing of the amplifier circuit 612 is similar to the amplifier circuit 212 of FIG. 2. A common mode extraction circuit 620 extracts a DC common mode voltage ($Vbias_{CM}$) used as a bulk voltage of diode connected transistor N7 of the bias circuit 622 to generate a gate bias voltage Vbiasn. The gate bias voltage is used to bias the gates of output devices N5 and N6, and the voltages of circuit nodes vp and vn are used to drive the bulks of output devices N5 and N6. The bulk of devices N5, N6, and N7 is isolated P-well. The P-well acts like a back gate terminal and provides extra gm to drive the output stage of the amplifier.

Figure 7:
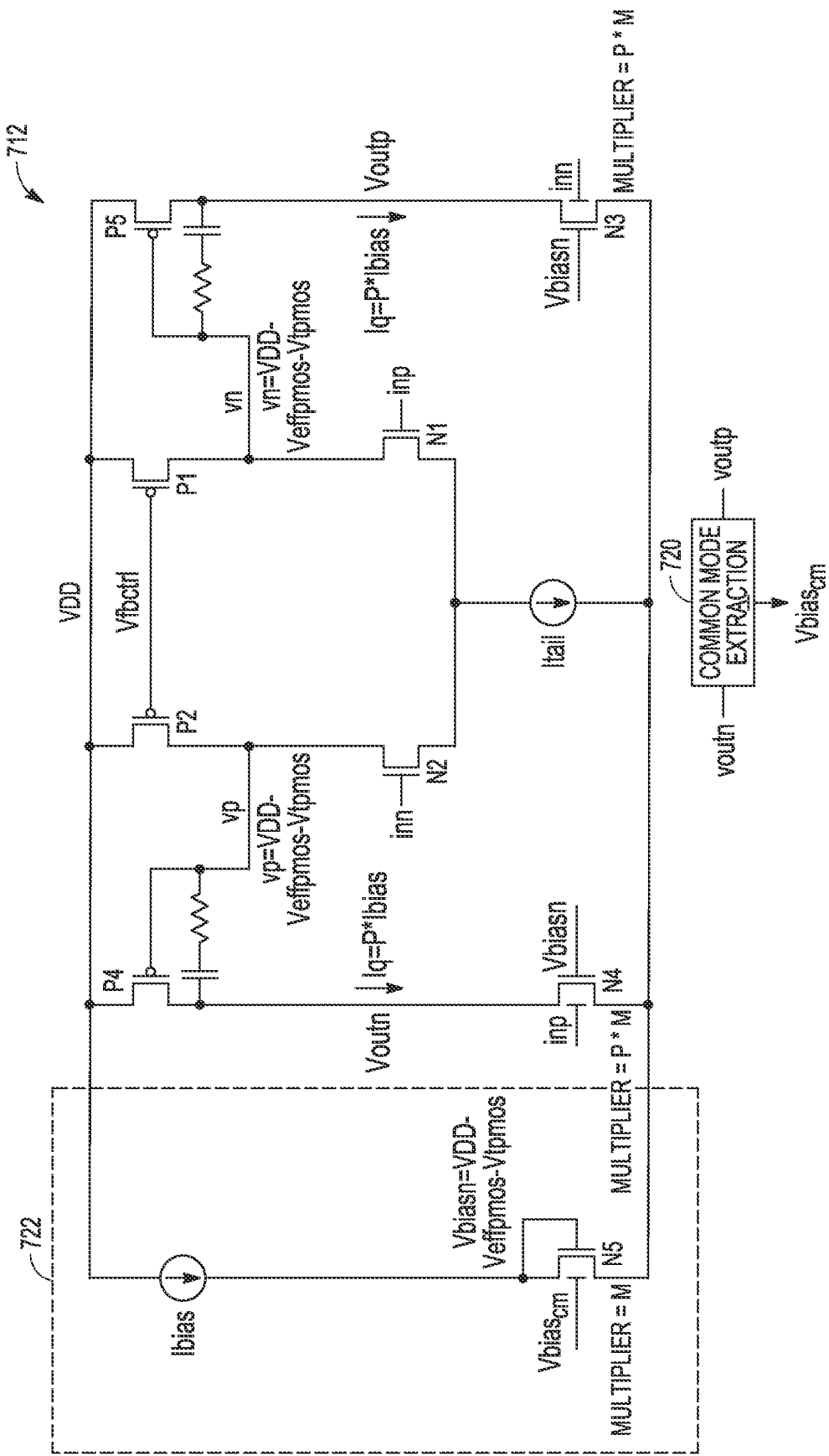

FIG. 7 is a circuit diagram of yet another example of an amplifier circuit 712. In the example, the common mode extraction circuit 720 extracts a DC common voltage from the output circuit stage that is used by the bias circuit 722 to generate a gate bias voltage (Vbiasn). The gate bias voltage is used to bias the gates of output devices N3 and N4, but the bulks or back gates of the output devices are driven differently. The bulks of N3 and N4 are connected to the gate regions of input devices N1 and N2, and the input signals (inp, inn) to the amplifier circuit 712 are used to drive the back gates of N3 and N4. If the output common mode is the same as the input common mode, the quiescent current Iq can be controlled over process, voltage, and temperature (PVT). In the example of FIG. 7, the dominant output devices are PFETs P4 and P5. A similar circuit example would have NFET dominant output devices (as in the amplifier circuit 312 of FIG. 3).

Figure 8:
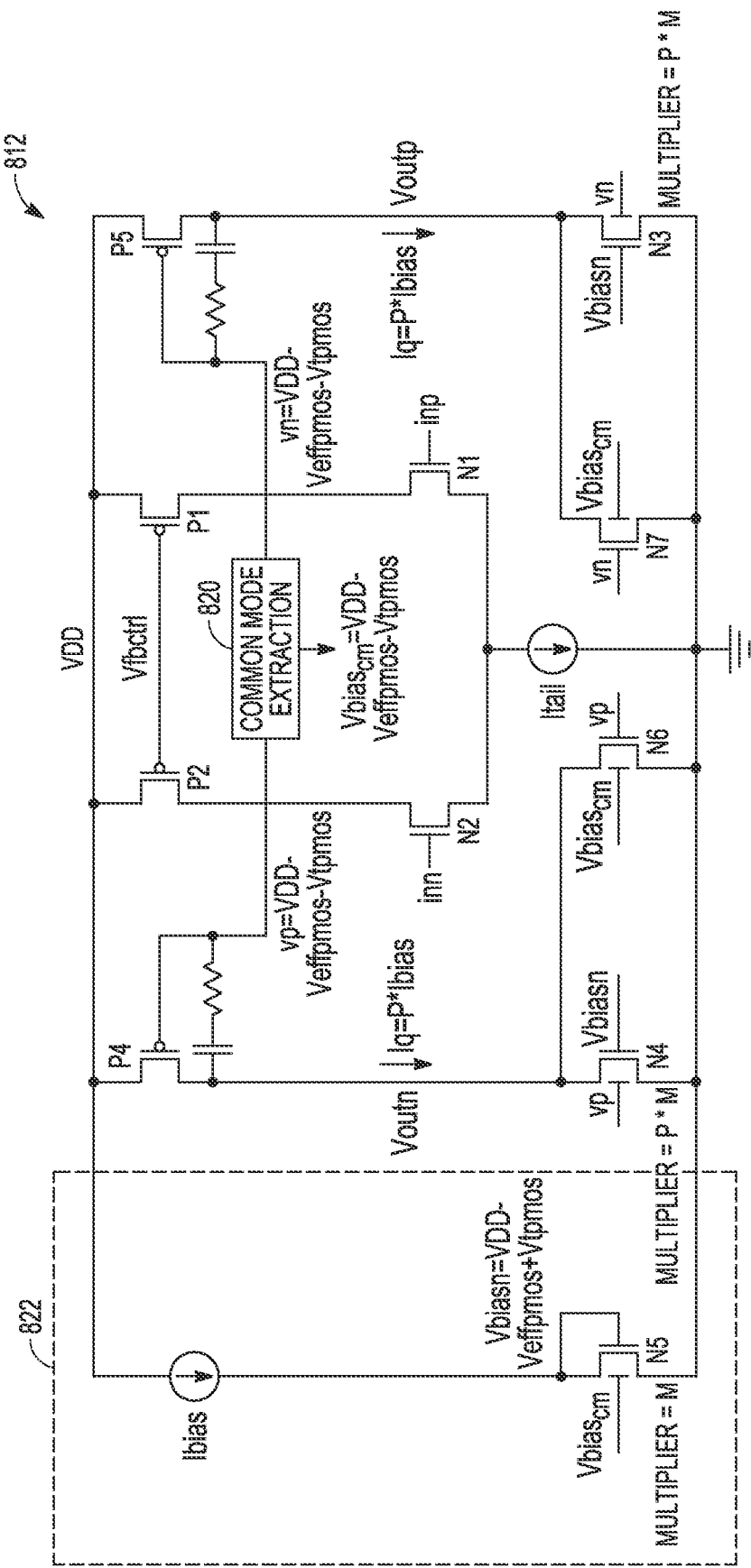

FIG. 8 is a circuit diagram of another example of an amplifier circuit 812. The example includes two output devices (labeled N6 and N7) added to the amplifier output circuit stage. The common mode extraction circuit 820 extracts a DC common mode voltage ($Vbias_{CM}$) from the input circuit stage that drives the bulk of the added transistors N6, N7 and drives the bulk or back gate of the diode-connected transistor N5 of the bias circuit 822. The bias circuit 822 generates a gate bias voltage to bias the gates of output devices N3 and N4. The voltage of circuit node vp is used to drive the bulk of output device N4 as a back gate and drive the gate region of output device N6, and the voltage of circuit node vn is used to drive the bulk of output device N3 as a back gate and drive the gate region of output device N7. This circuit configuration with added devices N6, N7 provides extra signal gain to the amplifier output circuit stage. In the example of FIG. 8, the dominant output devices are PFETs P4 and P5. A similar circuit example would have NFET dominant output devices (as in the amplifier circuit 312 of FIG. 3).

Figure 9:
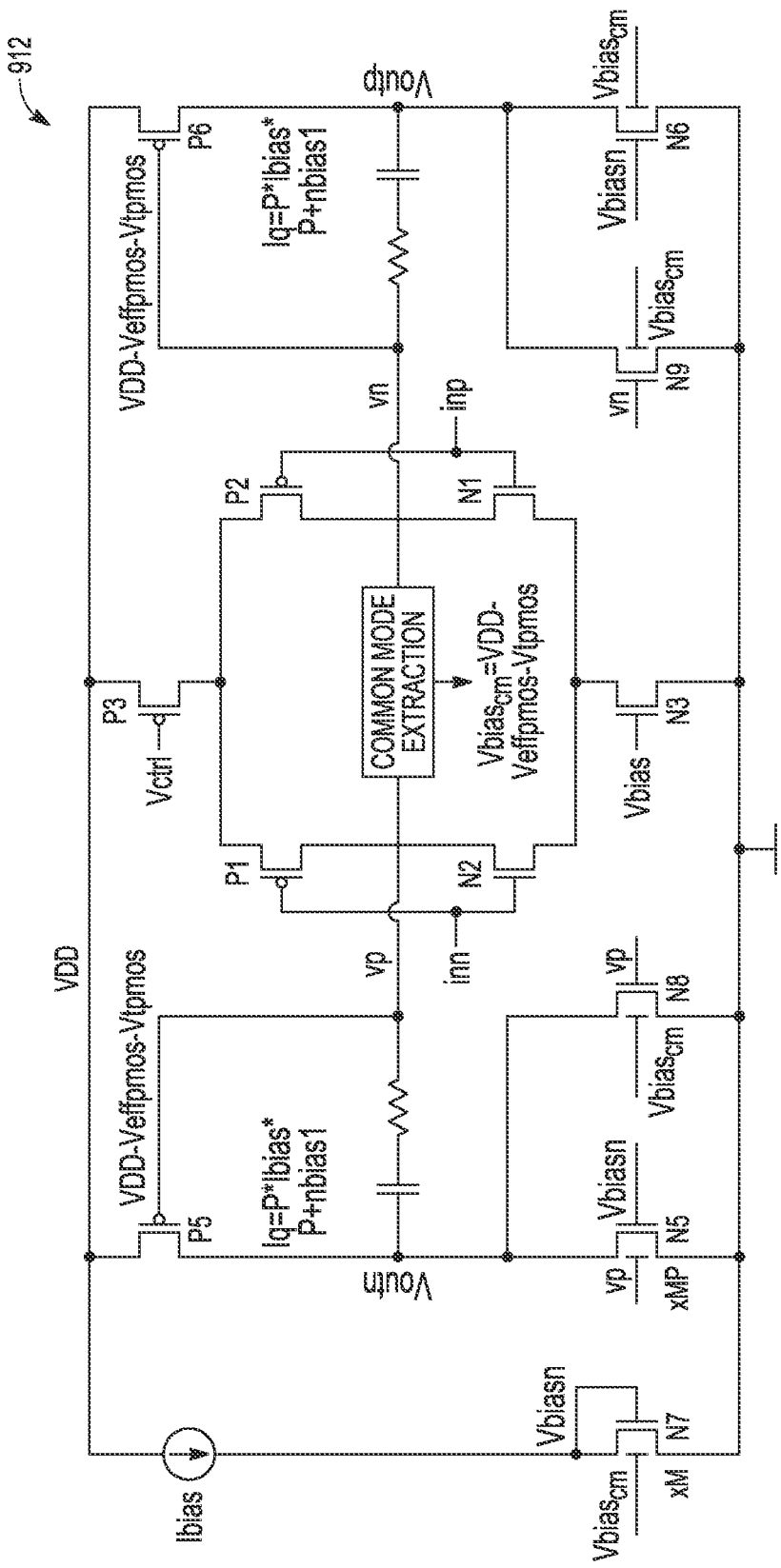

FIG. 9 is a circuit diagram of another example of an amplifier circuit 912. The example is similar to the example of FIG. 8 but includes complementary input device pairs P1, N1 and P2, N2. The input DC common mode is extracted and used to drive the bulks of output devices N8 and N9 as back gates. The voltages of circuit nodes vp and vn drive the gate regions of output devices N8 and N9, respectively, to provide extra signal gain to the output circuit stage. The dominant output devices are PFETs P5 and P6. A similar circuit example would have NFET dominant output devices (as in the amplifier circuit 312 of FIG. 3).

The devices, systems and methods described herein provide amplifier circuits having a basic class A amplifier circuit topology but provide push-pull capability. A single bias circuit serves both legs of the output circuit stage. The small bias circuit reduces circuit noise from typical class AB amplifier circuits that provide push-pull capability. The quiescent current in the output stage is PVT invariant. A common mode circuit includes filtering to suppress positive common mode feedback at higher frequencies.

The amplifier circuits have been described while referring to their use in a continuous time delta sigma modulator circuit, but the circuit configurations of the several examples can be useful in, among other things, discrete time delta sigma modulator circuits, power amplifiers, programmable gain amplifiers, radio frequency (RF) amplifiers, and instrumentation amplifiers.

Additional Description and Aspects

A first Aspect (Aspect 1) includes subject matter (such as an amplifier circuit) comprising a first amplifier circuit stage including input devices connected to inputs of the amplifier circuit, a second amplifier circuit stage coupled to the first amplifier stage, a common mode extraction circuit configured to extract a direct current (DC) common mode voltage of the first amplifier stage, and a bias circuit configured to bias one or more output devices of the second amplifier circuit stage using the DC common mode voltage.

In Aspect 2 the subject matter of Aspect 1 optionally includes a bias circuit that includes a diode connected transistor including a back gate of the transistor connected to the DC common mode voltage to produce a gate bias voltage, and a second amplifier circuit stage that includes a first output device having a gate region connected to the gate bias voltage and a back gate connected to a gate region of a second output device, and a third output device having a gate region connected to the gate bias voltage and a back gate connected to a gate region of a fourth output device.

In Aspect 3, the subject matter of Aspect 2 optionally includes a first amplifier circuit stage that includes a differential amplifier circuit including n-type field effect transistors (NFET) input devices, and the first and third output devices are NFET devices and the second and fourth output devices are p-type field effect transistor (PFET) devices.

In Aspect 4, the subject matter of Aspect 2 optionally includes a first amplifier circuit stage that includes a differential amplifier circuit including PFET input devices, and the first and third output devices are PFET devices and the second and fourth output devices are NFET devices.

In Aspect 5, the subject matter of one or any combination of Aspects 2-4 optionally includes a first amplifier circuit stage includes a differential amplifier circuit including NFET and PFET input devices.

In Aspect 6, the subject matter of one or any combination of Aspects 2-5 optionally includes a second amplifier circuit stage that includes a differential common source amplifier circuit.

In Aspect 7, the subject matter of one or any combination of Aspects 2-6 optionally includes a second amplifier circuit stage that includes a fifth output device having a drain or source region connected to a drain or source region of the first output device, a gate region coupled to the gate region of the second output device, and a back gate connected to the DC common mode voltage, and a sixth output device having a drain or source region connected to a drain or source region of the third output device, a gate region coupled to the gate region of the fourth output device, and a back gate connected to the DC common mode voltage.

In Aspect 8, the subject matter of Aspect 7 optionally includes a first amplifier circuit stage includes a differential amplifier circuit including NFET and PFET input devices.

In Aspect 9, the subject matter of one or any combination of Aspects 1-8 optionally includes a bias circuit includes a diode connected transistor including a back gate of the transistor connected to the DC common mode voltage to produce a gate bias voltage, and a second amplifier circuit stage that includes a first device having a gate region connected to the gate bias voltage and a back gate connected to a gate region of a first input device of the first amplifier circuit stage, and a second device having a gate region connected to the gate bias voltage and a back gate connected to a gate region of a second input device of the first amplifier circuit stage.

In Aspect 10, the subject matter of one or any combination of Aspects 1-8 optionally includes a bias circuit includes a diode connected transistor including a back gate of the transistor connected to the DC common mode voltage to produce a gate bias voltage, and a second amplifier circuit stage that includes a first output device having a gate region connected to the gate bias voltage and a back gate connected to a gate region of a second output device, and a third output device having a gate region connected to the gate bias voltage and a back gate connected to a gate region of a fourth output device.

In Aspect 11, the subject matter of one or any combination of Aspects 1-10 optionally includes a common mode extraction circuit that includes resistors and capacitors.

Aspect 12 includes subject matter (such as a method of operating an amplifier circuit) or can optionally be combined with one or any combination of Aspects 1-11 to include such subject matter, comprising receiving an input signal using a differential input circuit stage of the amplifier circuit, extracting a direct current (DC) common mode voltage of the differential input circuit stage, generating a gate bias voltage using the extracted DC common mode voltage, biasing multiple output devices of a differential output stage of the amplifier circuit using the gate bias voltage, and driving the differential output stage of the amplifier circuit using push-pull capability of the biased multiple output devices.

In Aspect 13, the subject matter of Aspect 12 optionally includes biasing a back gate of a diode connected transistor using the extracted DC common mode voltage, and biasing a gate region of the multiple output devices using the gate bias voltage.

In Aspect 14, the subject matter of Aspect 13 optionally includes driving output device pairs of the differential output stage, wherein an output device pair includes a gate-biased output device and another non-biased output device, and a back gate of the gate-biased output device is connected to a gate region of the other output device of the output device pair.

In Aspect 15, the subject matter of Aspect 13 optionally includes driving output device pairs of the differential output stage, wherein an output device pair includes a gate-biased output device and another non-biased output device, and driving an isolated well of the gate-biased output device and driving a gate region of the other device of the output device pairs using the differential input circuit stage of the amplifier circuit.

Aspect 16 includes subject matter (such as an electronic circuit) or can optionally be combined with one or any combination of Aspects 1-15 to include such subject matter, comprising an input circuit stage including a differential input amplifier circuit, a common mode extraction circuit configured to extract a direct current (DC) common mode voltage of the differential input amplifier circuit, an output circuit stage coupled to the input circuit stage and including a differential common source amplifier circuit, and a biasing circuit configured to bias gate regions of multiple output devices of the output circuit stage using the DC common mode voltage, wherein the gate-biased output devices have push-pull capability.

In Aspect 17, the subject matter of Aspect 16 optionally includes a bias circuit that includes a diode connected transistor including a back gate of the transistor connected to the DC common mode voltage to produce a gate bias voltage used to bias the gate regions of the gate-biased output devices, and a gate-biased output device that includes a first gate-biased output device having a back gate coupled to a gate region of a first non-biased output device, and a second gate-biased output device having a back gate coupled to a gate region of a second non-biased output device.

In Aspect 18, the subject matter of one or both of Aspects 16 and 17 optionally includes a quiescent current in the first gate-biased output device and the second gate-biased output device is constant.

In Aspect 19, the subject matter of one or any combination of Aspects 16-18 optionally includes a common mode extraction circuit includes a filter circuit.

In Aspect 20, the subject matter of one or any combination of Aspects 16-19 optionally includes each input of the differential amplifier circuit stage of the input circuit stage including an n-type field effect transistor (NFET) and p-type field effect transistor (PFET) pair.

These non-limiting Aspects can be combined in any permutation or combination. The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:
1. An amplifier circuit comprising:
a first amplifier circuit stage including input devices connected to inputs of the amplifier circuit;
a second amplifier circuit stage coupled to the first amplifier stage;
a common mode extraction circuit configured to extract a direct current (DC) common mode voltage of the first amplifier stage, wherein the common mode extraction circuit includes resistors and capacitors; and
a bias circuit configured to bias one or more output devices of the second amplifier circuit stage using the DC common mode voltage.
2. The amplifier circuit of claim 1,
wherein the bias circuit includes a diode connected transistor including a back gate of the transistor connected to the DC common mode voltage to produce a gate bias voltage; and
wherein the second amplifier circuit stage includes:
a first output device having a gate region connected to the gate bias voltage and a back gate connected to a gate region of a second output device; and
a third output device having a gate region connected to the gate bias voltage and a back gate connected to a gate region of a fourth output device.
3. The amplifier circuit of claim 2,
wherein the first amplifier circuit stage includes a differential amplifier circuit including n-type field effect transistors (NFET) input devices; and
wherein the first and third output devices are NFET devices and the second and fourth output devices are p-type field effect transistor (PFET) devices.
4. The amplifier circuit of claim 2,
wherein the first amplifier circuit stage includes a differential amplifier circuit including PFET input devices; and
wherein the first and third output devices are PFET devices and the second and fourth output devices are NFET devices.
5. The amplifier circuit of claim 2, wherein the first amplifier circuit stage includes a differential amplifier circuit including NFET and PFET input devices.
6. The amplifier circuit of claim 2, wherein the second amplifier circuit stage includes a differential common source amplifier circuit.
7. The amplifier circuit of claim 2, wherein the second amplifier circuit stage further includes:
a fifth output device having a drain or source region connected to a drain or source region of the first output device, a gate region coupled to the gate region of the second output device, and a back gate connected to the DC common mode voltage; and
a sixth output device having a drain or source region connected to a drain or source region of the third output device, a gate region coupled to the gate region of the fourth output device, and a back gate connected to the DC common mode voltage.
8. The amplifier circuit of claim 7, wherein the first amplifier circuit stage includes a differential amplifier circuit including NFET and PFET input devices.

9. The amplifier circuit of claim 1,
wherein the bias circuit includes a diode connected transistor including a transistor back gate connected to the DC common mode voltage to produce a gate bias voltage; and
wherein the second amplifier circuit stage includes:
a first device having a gate region connected to the gate bias voltage and a back gate connected to a gate region of a first input device of the first amplifier circuit stage; and
a second device having a gate region connected to the gate bias voltage and a back gate connected to a gate region of a second input device of the first amplifier circuit stage.
10. The amplifier circuit of claim 1,
wherein the bias circuit includes a diode connected transistor including a back gate of the transistor connected to the DC common mode voltage to produce a gate bias voltage; and
wherein the second amplifier circuit stage includes:
a first output device having a gate region connected to the gate bias voltage and a back gate connected to a gate region of a second output device; and
a third output device having a gate region connected to the gate bias voltage and a back gate connected to a gate region of a fourth output device.
11. A method of operating an amplifier circuit, the method comprising:
receiving an input signal using a differential input circuit stage of the amplifier circuit;
extracting a direct current (DC) common mode voltage of the differential input circuit stage;
generating a gate bias voltage by biasing a back gate of a diode connected transistor using the extracted DC common mode voltage; and
biasing multiple output devices of a differential output stage of the amplifier circuit by biasing a gate region of the multiple output devices using the gate bias voltage; and
driving the differential output stage of the amplifier circuit using push-pull capability of the biased multiple output devices.
12. The method of claim 11, wherein driving the differential output stage includes driving output device pairs of the differential output stage, wherein an output device pair includes a gate-biased output device and another non-biased output device, and a back gate of the gate-biased output device is connected to a gate region of the other output device of the output device pair.
13. The method of claim 11, wherein driving the differential output stage includes:
driving output device pairs of the differential output stage, wherein an output device pair includes a gate-biased output device and another non-biased output device; and
driving an isolated well of the gate-biased output device and driving a gate region of the other device of the output device pairs using the differential input circuit stage of the amplifier circuit.
14. An electronic circuit comprising:
an input circuit stage including a differential input amplifier circuit, wherein each input of the differential amplifier circuit stage of the input circuit stage includes an n-type field effect transistor (NFET) and a p-type field effect transistor (PFET) pair;

a common mode extraction circuit configured to extract a direct current (DC) common mode voltage of the differential input amplifier circuit;

an output circuit stage coupled to the input circuit stage and including a differential common source amplifier circuit; and a biasing circuit configured to bias gate regions of multiple output devices of the output circuit stage using the DC common mode voltage, wherein the gate-biased output devices have push-pull capability.

15. The electronic circuit of claim 14, wherein the bias circuit includes a diode connected transistor including a back gate of the transistor connected to the DC common mode voltage to produce a gate bias voltage used to bias the gate regions of the gate-biased output devices; and wherein the gate-biased output devices include:

a first gate-biased output device having a back gate coupled to a gate region of a first non-biased output device; and a second gate-biased output device having a back gate coupled to a gate region of a second non-biased output device.

16. The electronic circuit of claim 14, wherein a quiescent current in the first gate-biased output device and the second gate-biased output device is constant.

17. The electronic circuit of claim 14, wherein the common mode extraction circuit includes a filter circuit.

* * * * *